(12) United States Patent
Meguro et al.

(10) Patent No.: US 7,473,460 B2
(45) Date of Patent: Jan. 6, 2009

(54) CERAMIC SUBSTRATE, ELECTRONIC APPARATUS, AND METHOD FOR PRODUCING CERAMIC SUBSTRATE

(75) Inventors: Toru Meguro, Yasu (JP); Ryuichiro Wada, Kyoto (JP); Yoshifumi Saito, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/755,144

(22) Filed: May 30, 2007

(65) Prior Publication Data

US 2007/0224400 A1    Sep. 27, 2007

Related U.S. Application Data

(63) Continuation of application No. PCT/JP2006/322540, filed on Nov. 13, 2006.

(30) Foreign Application Priority Data

| Nov. 30, 2005 | (JP) | ............................. 2005-346851 |
| Apr. 19, 2006 | (JP) | ............................. 2006-116036 |
| Oct. 17, 2006 | (JP) | ............................. 2006-282823 |

(51) Int. Cl.
 *B32B 9/00* (2006.01)
 *H01L 23/48* (2006.01)
(52) U.S. Cl. .................... 428/210; 174/50.53; 174/258; 257/779; 257/786; 361/762
(58) Field of Classification Search ................. 428/210; 174/255, 50.53, 258; 257/779, 786; 361/762
See application file for complete search history.

(56) References Cited

U.S. PATENT DOCUMENTS 5,710,071 A * 1/1998 Beddingfield et al. ....... 438/108

5,855,711 A * 1/1999 Araki et al. ............... 156/89.16

(Continued)

FOREIGN PATENT DOCUMENTS

JP    54-122871 A    9/1979

(Continued)

OTHER PUBLICATIONS

Official Communication for PCT Application No. PCT/JP2006/322540; mailed on Dec. 5, 2006.

*Primary Examiner*—Cathy Lam
(74) *Attorney, Agent, or Firm*—Keating & Bennett, LLP (57) ABSTRACT

A ceramic substrate includes a glass layer partially overlaying a conductor, and the glass layer has satisfactory adhesion to the main body of the ceramic substrate and having satisfactory plating resistance. The glass layer is arranged to extend from a portion of the conductor formed on a first main surface of the main body of the ceramic substrate to the first main surface of the main body of the ceramic substrate and which has a double-layered structure including a first glass sublayer composed of a first glass material, and a second glass sublayer formed on the first glass sublayer and composed of a second glass material that is different from the second glass material defining the first glass sublayer, the first glass material having more satisfactory adhesion to the main body of the ceramic substrate than the second glass material, and the first glass material having more satisfactory plating resistance than the first glass material.

7 Claims, 8 Drawing Sheets

U.S. PATENT DOCUMENTS

| | | | |
|---|---|---|---|
| 6,025,649 A * | 2/2000 | DiGiacomo | 257/779 |
| 6,187,418 B1 * | 2/2001 | Fasano et al. | 428/210 |
| 6,228,196 B1 * | 5/2001 | Sakamoto et al. | 156/89.17 |
| 6,337,445 B1 * | 1/2002 | Abbott et al. | 174/260 |
| 6,784,554 B2 * | 8/2004 | Kajiwara et al. | 257/778 |
| 6,811,635 B2 * | 11/2004 | Sakamoto et al. | 156/89.16 |
| 6,934,000 B1 * | 8/2005 | Ishii et al. | 349/149 |
| 7,344,971 B2 * | 3/2008 | Aoyagi | 438/615 |

FOREIGN PATENT DOCUMENTS

| | | |
|---|---|---|
| JP | 4-359489 A | 12/1992 |
| JP | 2000-223821 A | 8/2000 |
| JP | 2002-231860 A | 8/2002 |
| JP | 2005-268392 A | 9/2005 |

* cited by examiner

CERAMIC SUBSTRATE, ELECTRONIC APPARATUS, AND METHOD FOR PRODUCING CERAMIC SUBSTRATE

BACKGROUND OF THE INVENTION

1. Field of the Invention

The present invention relates to a ceramic substrate, an electronic apparatus, and a method for producing a ceramic substrate. Specifically, the present invention relates to a ceramic substrate mounted on a mounting board by connecting a conductor disposed on a first main surface of the ceramic substrate to a mounting land of the mounting board with solder, an electronic apparatus, and a method for producing the ceramic substrate.

2. Description of the Related Art

Figure 10:
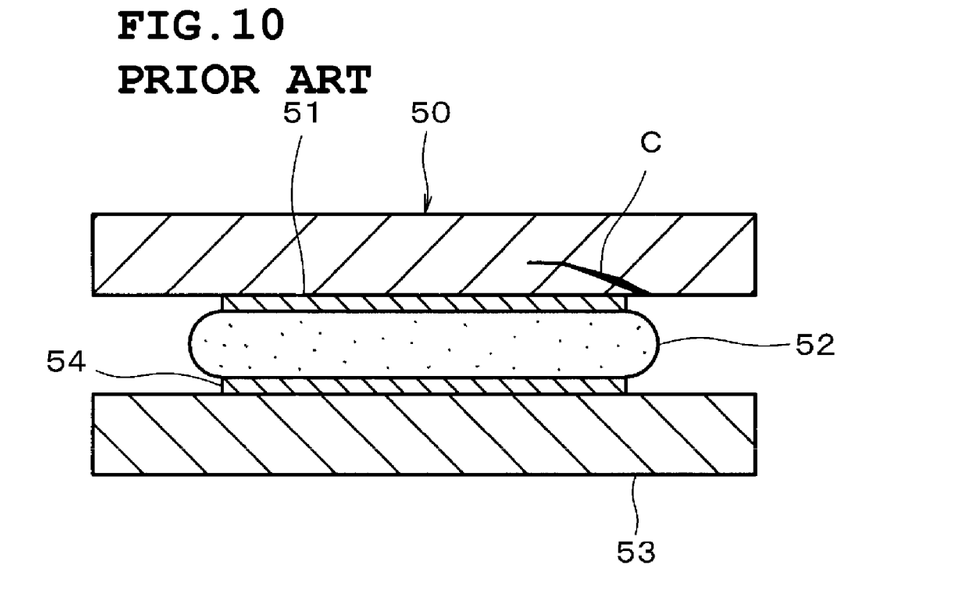
FIG. 10 shows a state in which a land electrode formed on a first main surface of a known ceramic substrate is connected to a mounting land on a mounting board with solder.

In a ceramic substrate, typically a ceramic substrate 50 is configured to be mounted on a mounting board 53 by connection between a land electrode 51 provided on a first main surface of the ceramic substrate 50 and a mounting land 54 of the mounting board 53 with solder 52, as shown in FIG. 10.

However, as shown in FIG. 10, when the land electrode 51 of the ceramic substrate 50 has a dimension that is substantially equal to that of the mounting land 54 of the mounting board 53, for example, a stress due to the difference in thermal expansion coefficient between the ceramic substrate 50 and the mounting board 53 during a heat-cycle test of a product concentrates on the edge of the land electrode 51, and in some cases, a crack C occurs in the ceramic substrate 50.

Figure 11:
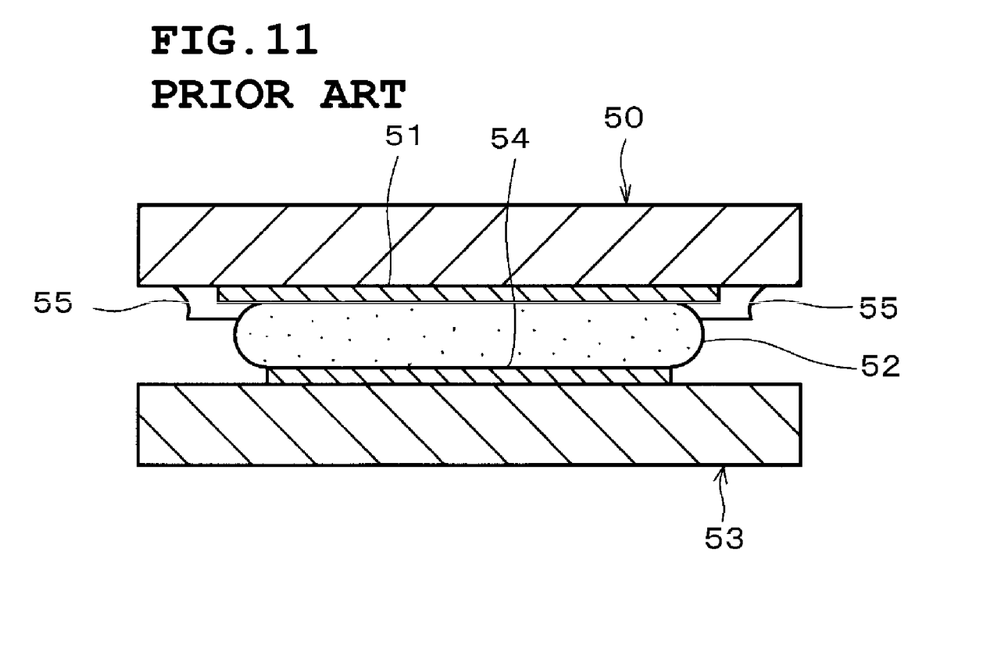
FIG. 11 shows a structure of a land electrode and its vicinity on another known ceramic substrate.

As shown in FIG. 11, a method for preventing the occurrence of a crack in the ceramic substrate 50 and a failure due to migration in the land electrode 51 by coating the periphery of the land electrode 51 with a glass layer 55 so as to relax stress concentration during heat-cycle test is disclosed in, for example, Japanese Unexamined Patent Application Publication No. 2002-231860 (Patent Document 1).

Patent Document 1 also discloses that a glass material of the glass layer 55 is preferably composed of a glass material primarily composed of a glass material incorporated in a ceramic material (dielectric ceramic layer) of the ceramic substrate 50 from the viewpoint of the enhancement of adhesion between the glass layer 55 and the ceramic substrate 50.

However, in accordance with a common method for producing a ceramic substrate, various types of plating films, such as a Ni plating film for preventing solder leaching, a Sn plating film for improving solderability, and an Au plating film for improving connection reliability, are formed on the surface of the land electrode 51 after the formation of the glass layer 55. Thereby, the plating resistance of the glass layer 55 is easily degraded, depending on the type of the glass material. This disadvantageously leads to the occurrence of a pinhole due to erosion caused by the plating solution.

When the glass layer 55 is composed of a glass material primarily composed of a glass material incorporated in a ceramic layer (dielectric layer) of the ceramic substrate 50 from the viewpoint of the enhancement of adhesion between the ceramic substrate 50 and the glass layer 55, the glass material incorporated in the ceramic layer is usually selected based on electrical properties and not based on plating resistance. Thus, disadvantageously, the plating resistance of the glass layer 55 is easily degraded, which causes serious problems due to erosion caused by the plating solution.

SUMMARY OF THE INVENTION

To overcome the problems described above, preferred embodiments of the present invention provide a highly reliable ceramic substrate that does not cause a heat-cycle-induced stress concentration on a conductor due to a glass material partially overlaying the conductor, wherein a glass layer partially overlaying the conductor has a superior adhesion to the main body of the ceramic substrate and a superior plating resistance, and also provide an electronic apparatus including the ceramic substrate, and a method for producing the ceramic substrate.

A ceramic substrate according to a preferred embodiment of the present invention includes a main body of the ceramic substrate, a conductor disposed on a first main surface of the main body of the ceramic substrate and a glass layer extending from a portion of the conductor to the first main surface of the main body of the ceramic substrate. The glass layer includes a first glass sublayer made of a first glass material and extending from the portion of the conductor to the first main surface of the main body of the ceramic substrate, and a second glass sublayer made of a second glass material different from the first glass material defining the first glass sublayer, the second glass sublayer being disposed on the first glass sublayer. The first glass material has a greater adhesion to the main body of the ceramic substrate than the second glass material, and the second glass material has a greater plating resistance than the first glass material.

Preferably, a ceramic material defining the main body of the ceramic substrate includes a glass material. The first glass material preferably has the same composition as the glass material included in the ceramic material defining the main body of the ceramic substrate. The second glass material is less soluble in a plating solution than the first glass material.

Preferably, the glass layer is arranged to overlay a periphery of the conductor disposed on the main surface of the main body of the ceramic substrate.

Preferably, the second glass sublayer is arranged to overlay substantially the entire first glass sublayer.

Preferably, the first glass material includes a borosilicate glass, and the second glass material includes a glass material primarily composed of Si, B, and Zn.

Preferably, a plating film is provided on a surface of the conductor.

Preferably, an electronic apparatus includes a mounting board, and the conductor of the ceramic substrate_according to this preferred embodiment, wherein the conductor is connected to the mounting board with solder.

A method for producing a ceramic substrate according to another preferred embodiment includes the steps of forming a green ceramic laminate including a conductor disposed on a first main surface of a laminate in which a plurality of ceramic green sheets are stacked, a first glass sublayer made of a first glass material and extending from a portion of the conductor to the first main surface of the laminate, and a second glass sublayer made of a second glass material different from the first glass material defining the first glass sublayer and disposed on the first glass sublayer, the first glass material having a greater adhesion to the laminate than the second glass material, and the second glass material having a greater plating resistance than the first glass material, and firing the green ceramic laminate.

Preferably, the first glass sublayer is formed so as to overlay the periphery of the conductor.

Preferably, the second glass sublayer is formed so as to overlay substantially the entire first glass sublayer.

In the step of firing the ceramic laminate, the ceramic laminate is preferably fired while a shrinkage-inhibiting green sheet composed of a ceramic material that is not substantially sintered at a firing temperature of the ceramic laminate is disposed on at least the first main surface of the ceramic laminate.

The method for producing a ceramic substrate according to this preferred embodiment preferably further includes a step of forming a plating film on a surface of the conductor after the step of firing the green ceramic laminate.

The glass layer preferably includes the first glass sublayer made of the first glass material and extending from a portion of the conductor to the first main surface of the main body of the ceramic substrate and the second glass sublayer made of the second glass material different from the first glass material defining the first glass sublayer, the second glass sublayer being disposed on the first glass sublayer. The first glass material has a greater adhesion to the main body of the ceramic substrate than that of the second glass material, and the second glass material has a greater plating resistance than that of the first glass material. For example, a glass sublayer having a greater adhesion to the main body of the ceramic substrate is provided as the first glass sublayer. A glass sublayer, as the second glass sublayer, having a greater plating resistance than the first glass sublayer is provided on the first glass sublayer. Thereby, a highly reliable ceramic substrate is obtained that does not cause a heat-cycle-induced stress concentration on the conductor since the conductor is partially covered with the glass material, wherein the glass layer partially overlaying the conductor has a superior adhesion to the main body of the ceramic substrate and has a superior plating resistance.

The ceramic substrate preferably includes the ceramic material defining the main body of the ceramic substrate that includes the glass material, the first glass material having the same composition as the glass material included in the ceramic material defining the main body of the ceramic substrate, and the second glass material being less soluble in a plating solution. In this case, it is possible to more reliably obtain the highly reliable ceramic substrate including the glass layer partially overlaying the conductor, the glass layer having a greater adhesion to the main body of the ceramic substrate and having a greater plating resistance, and to make preferred embodiments of the present invention more effective.

Examples of the second glass material, i.e., the glass material that is less soluble in a plating solution, include a glass material having a high Zn content, for example, having a Zn content of 10 percent by weight or greater; a glass material having a Sr content of 7 percent by weight or greater; and a Zn—Al—Ba—Si—Sr—Zr—Ca—Mg—Ti-based glass material. These glass materials have excellent plating resistances, in particular, when a neutral plating solution is used.

The ceramic substrate preferably includes the glass layer arranged to overlay the periphery of the conductor disposed on the main surface of the main body of the ceramic substrate. In this case, covering the periphery of the conductor, on which a stress is likely to be concentrated, with the glass layer efficiently suppresses and prevents the stress concentration and makes preferred embodiments of the present invention more effective.

The ceramic substrate preferably includes the second glass sublayer arranged to overlay substantially the entire first glass sublayer. In this case, it is possible to provide a structure in which only the second glass sublayer having an excellent plating resistance is exposed at the surface and to obtain a highly reliable ceramic substrate that is not eroded during plating.

The ceramic substrate of preferably includes the first glass material including a borosilicate glass, and the second glass material including a glass material primarily composed of Si, B, and Zn. In this case, it is possible to obtain a highly reliable ceramic substrate including the glass layer having improved adhesion to the main body of the ceramic substrate and improved plating resistance.

The ceramic substrate preferably includes the plating film provided on the surface of the conductor. In this case, the plating film has improved properties, such as solderability and electrical connection reliability. Thus, the ceramic substrate having desired properties is obtained.

The conductor of the ceramic substrate is securely connected to a mounting board with solder, and a portion of the conductor of the ceramic substrate is covered with the glass layer having a double-layered structure. Thus, adhesion to the main body of the ceramic substrate and plating resistance are outstanding. Therefore, it is possible to obtain the highly reliable electronic apparatus including the highly reliable ceramic substrate mounted on the mounting board.

The method for producing a ceramic substrate according to a preferred embodiment of the present invention includes the steps of forming a green ceramic laminate including a conductor disposed on a first main surface of a laminate in which a plurality of ceramic green sheets are stacked, a first glass sublayer made of a first glass material and extending from a portion of the conductor to the first main surface of the laminate, and a second glass sublayer made of a second glass material different from the first glass material constituting the first glass sublayer and disposed on the first glass sublayer, the first glass material having a greater adhesion to the main body of the ceramic substrate than the second glass material, and the second glass material having a greater plating resistance than the first glass material, and firing the green ceramic laminate. Thus, it is possible to efficiently produce the highly reliable ceramic substrate including the glass layer having the double-layered structure including the first glass sublayer and the second glass sublayer, the glass layer extending from a portion of the conductor formed on the first main surface of the main body of the ceramic substrate to the first main surface of the main body of the ceramic substrate, and the glass layer partially overlaying the conductor having an excellent adhesion to the main body of the ceramic substrate and an excellent plating resistance.

The method for producing the ceramic substrate preferably includes forming the first glass sublayer so as to overlay the periphery of the conductor. In this case, covering the periphery of the conductor, on which a stress is likely to be concentrated, with the glass layer efficiently suppresses and prevents the stress concentration and makes the invention more effective.

The method for producing the ceramic substrate preferably includes forming the second glass sublayer so as to substantially overlay the entire first glass sublayer. In this case, it is possible to provide a structure in which only the second glass sublayer having better plating resistance than the first glass sublayer is exposed and to obtain a highly reliable ceramic substrate that is not eroded during plating.

The method for producing the ceramic substrate preferably includes the step of firing the ceramic laminate while the shrinkage-inhibiting green sheet composed of the ceramic material that is not substantially sintered at the firing temperature of the ceramic laminate is disposed on at least the first main surface of the ceramic laminate. In this case, in the firing step, the ceramic laminate can be fired while shrinkage in the direction parallel to a main surface of the ceramic laminate is suppressed and prevented, thereby more surely producing the highly reliable ceramic substrate having intended properties.

The method for producing the ceramic substrate preferably further includes the step of forming the plating film on the surface of the conductor after the step of firing the ceramic laminate. In this case, the plating film improves properties such as solderability and electrical connection reliability. Thus, the ceramic substrate having intended properties is obtained.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the present invention will be described in detail below with reference to the corresponding drawings.

Preferred Embodiment 1

A method for producing a ceramic substrate according to a preferred embodiment of the present invention will be described below.

Production of Ceramic Substrate

Equal weights of an alumina powder and a crystallized-glass powder obtained by mixing $SiO_2$, $Al_2O_3$, $B_2O_3$, and CaO were mixed to form a mixed powder.

To 100 parts by weight of the resulting mixed powder, 15 parts by weight of polyvinyl butyral, 40 parts by weight of isopropyl alcohol, and 20 parts by weight of toluol(toluene) were added, and then the mixture was mixed for about 24 hours with a ball mill to form a slurry.

The resulting slurry was formed into ceramic green sheets each having a thickness of about 120 μm by a doctor blade method.

As a substrate for a heat cycle evaluation, through holes for interlayer connection were formed in each of the resulting ceramic green sheets. The through holes were filled with a conductive paste. A conductive paste was applied to surfaces of the ceramic green sheets to form patterns to be in-plane conductors.

The conductive paste with which the through holes were filled and the conductive paste for forming the in-plane conductors were each prepared by mixing 83 percent by weight of a Ag powder, 15 percent by weight of propylene glycol phenyl ether-texanol, and 2 percent by weight of ethyl cellulose. Alternatively, the conductive paste with which the through holes were filled may be different from the conductive paste for forming the in-plane conductors.

The in-plane conductors each had a thickness of about 20 μm.

For the ceramic green sheet which defines a surface layer and with which conductors to be formed into land electrodes are provided, the through holes for interlayer connection were formed in the sheet, and the through holes were filled with the conductive paste. Then, the conductive paste for the conductors to be formed into the land electrodes was applied to a surface thereof by printing. The conductive paste for the conductors was the same as the conductive paste used for the through holes.

Alternatively, a conductive paste different from the conductive paste used for the through holes may be used.

Furthermore, the conductive paste with which the through holes were filled may be different from the conductive paste for forming the in-plane conductors.

The conductors were not limited to conductors that were made from the conductive paste, but may be formed of metal foil.

A glass material having the same composition as the glass material included in the ceramic green sheet was formed into a glass paste. The resulting glass paste was applied by printing so as to extend from a portion of each conductor to the ceramic green sheet for the surface layer, thereby forming a first glass sublayer.

In this preferred embodiment, the crystallized glass material obtained by mixing $SiO_2$, $Al_2O_3$, $B_2O_3$, and CaO was used as the glass material incorporated in the ceramic material of the main body of the ceramic substrate. Thus, the glass material for the first glass sublayer was the same as the crystallized glass. That is, the crystallized glass obtained by mixing $SiO_2$, $Al_2O_3$, $B_2O_3$, and CaO in the following amounts was used as the glass material for the first glass sublayer. The glass material for the first glass sublayer has better adhesion to the main body of the ceramic substrate than the glass material for a second glass sublayer described later.

$SiO_2$: 43 percent by weight
$Al_2O_3$: 8 percent by weight
$B_2O_3$: 6 percent by weight
CaO: 43 percent by weight Then, 30 parts by weight of dibutyl carbitol and 15 parts by weight of ethyl cellulose were mixed with 100 parts by weight of the total amount of about 53.2 percent by weight of this glass powder and about 46.8 percent by weight of an alumina powder. Thereby, the glass paste for the first glass sublayer was prepared.

Alternatively, a glass paste prepared by mixing propylene glycol phenyl ether-texanol in place of dibutyl carbitol may be used as the glass paste for the first glass sublayer.

The resulting glass paste was applied by printing to form the first glass sublayer having a thickness such that a thickness after firing is about 8 µm.

Preferably, the thickness (thickness after firing) of the first glass sublayer is about 5 µm to about 10 µm. A thickness of the first glass sublayer of less than about 5 µm increases the number of pores in the film. Thus, the resulting film is porous, which is not preferred. A thickness of the first glass sublayer exceeding about 10 µm increases the step height between the first glass sublayer and the conductor (electrode) to cause delamination, which is not preferred.

Alternatively, in the case in which a $SiO_2$—$Al_2O_3$—$B_2O_3$—CaO-based glass is used as the glass material for the first glass sublayer, preferably, the $SiO_2$—$Al_2O_3$—$B_2O_3$—CaO-based glass has the following composition:

$SiO_2$: 28 to 44 percent by weight
$Al_2O_3$: 0 to 20 percent by weight
$B_2O_3$: 0 to 17.5 percent by weight
CaO: 36 to 50 percent by weight Alternatively, a $SiO_2$—$B_2O_3$—BaO-based glass, a $SiO_2$—$B_2O_3$—$K_2O$-based glass, or other suitable material than the above-described glass materials may be used as the glass material for the first glass sublayer.

Furthermore, a glass material primarily composed of $SiO_2$, $Al_2O_3$, and ZnO was formed into a glass paste. The resulting glass paste was applied to the first glass sublayer by printing to form a second glass sublayer.

A glass material having a satisfactory plating resistance is preferably used as the glass material for the second glass sublayer. For example, a glass material including at least about 10% of Zn is preferred.

More preferably, a glass material having a satisfactory adhesion to the first glass sublayer is used as the glass material for the second glass sublayer. For example, when the glass material for the first glass sublayer includes Ca, Ca cannot be used as the glass material for the second glass sublayer since Ca dissolves easily in a plating solution. However, the use of Zn, which is in the same Group as Ca and has a higher plating resistance, results in the formation of the second glass sublayer having satisfactory plating resistance and satisfactory adhesion to the first glass sublayer.

Alternatively, a glass material including at least about 7% of Sr may be used as the glass material for the second glass sublayer. The incorporation of Sr in the crystal of the glass provides a glass that does not readily dissolve in a plating solution. Furthermore, for example, a Zn—Al—Ba—Si—Sr—Zr—Ca—Mg—Ti-based glass may be used.

In this preferred embodiment, a glass paste was prepared by mixing 5 percent by weight of propylene glycol phenyl ether-texanol, 16 percent by weight of ethyl cellulose, and 79 percent by weight of a glass powder obtained by mixing $SiO_2$, $Al_2O_3$, and ZnO in amounts as follows:

$SiO_2$: 50 parts by weight
$Al_2O_3$: 28 parts by weight
ZnO: 22 parts by weight The resulting glass paste was used as the glass paste for the second glass sublayer.

The glass paste for the second glass sublayer forms a second glass sublayer having a greater plating resistance than the first glass sublayer.

The resulting glass paste was applied by printing to form the second glass sublayer having a thickness such that the thickness after filing is about 15 µm.

Preferably, the thickness (thickness after firing) of the second glass sublayer is about 10 µm to about 20 µm. A thickness of the second glass sublayer of less than about 10 µm increases the number of pores in the film. Thus, the resulting film is porous, which is not preferred. At a thickness of the second glass sublayer exceeding about 20 µm, in the case where the conductors, the first glass sublayer and second glass sublayer are formed by a transfer method described later, when the glass paste for the first glass sublayer is applied by printing to the second glass sublayer, spreading (blur of paste) is disadvantageously increased. Furthermore, after the formation of the glass sublayers, when the conductive paste for the conductor is applied, filling properties of the conductive paste are disadvantageously degraded.

The total thickness of the first glass sublayer and the second glass sublayer is preferably in the range of about 15 µm to about 30 µm, for example. When the total thickness of the first glass sublayer and the second glass sublayer is less than about 15 µm, environmental resistance is degraded due to pores in the glass sublayers. A total thickness exceeding about 30 µm results in a reduction in the adhesiveness of the plating film and a mounting failure, which is not preferred.

The resulting ceramic green sheets were appropriately combined and stacked to form a laminate having 10 stacked layers. The resulting laminate was press-bonded at a pressure of about 50 MPa and a temperature of about 60° C. to form a green ceramic laminate.

The green ceramic laminate was disposed on a tray formed of an alumina plate, heated at about 600° C. for about 3 hours, and then heated at about 900° C. for about 1 hour to sinter the ceramic.

When firing the green ceramic laminate, during the step of firing the ceramic laminate, the ceramic laminate may be fired with a shrinkage-inhibiting green sheet composed of a ceramic material that is not substantially sintered at the firing temperature of the ceramic laminate arranged on the first main surface or both main surfaces of the ceramic laminate. In this case, in the firing step, the ceramic laminate can be fired while shrinkage in the direction parallel to the main surface of the ceramic laminate is prevented.

Surfaces of the conductors to be formed into land electrodes were plated with Ni to form a Ni plating film having a thickness of about 5 µm and then plated with Au to form an Au plating film having a thickness of about 0.4 µm, thereby obtaining a ceramic substrate having a multilayer structure in which all of the peripheries of the conductors to be formed into the land electrodes were covered with the glass layer having a double-layered structure including the first glass sublayer and the second glass sublayer.

Figure 1:
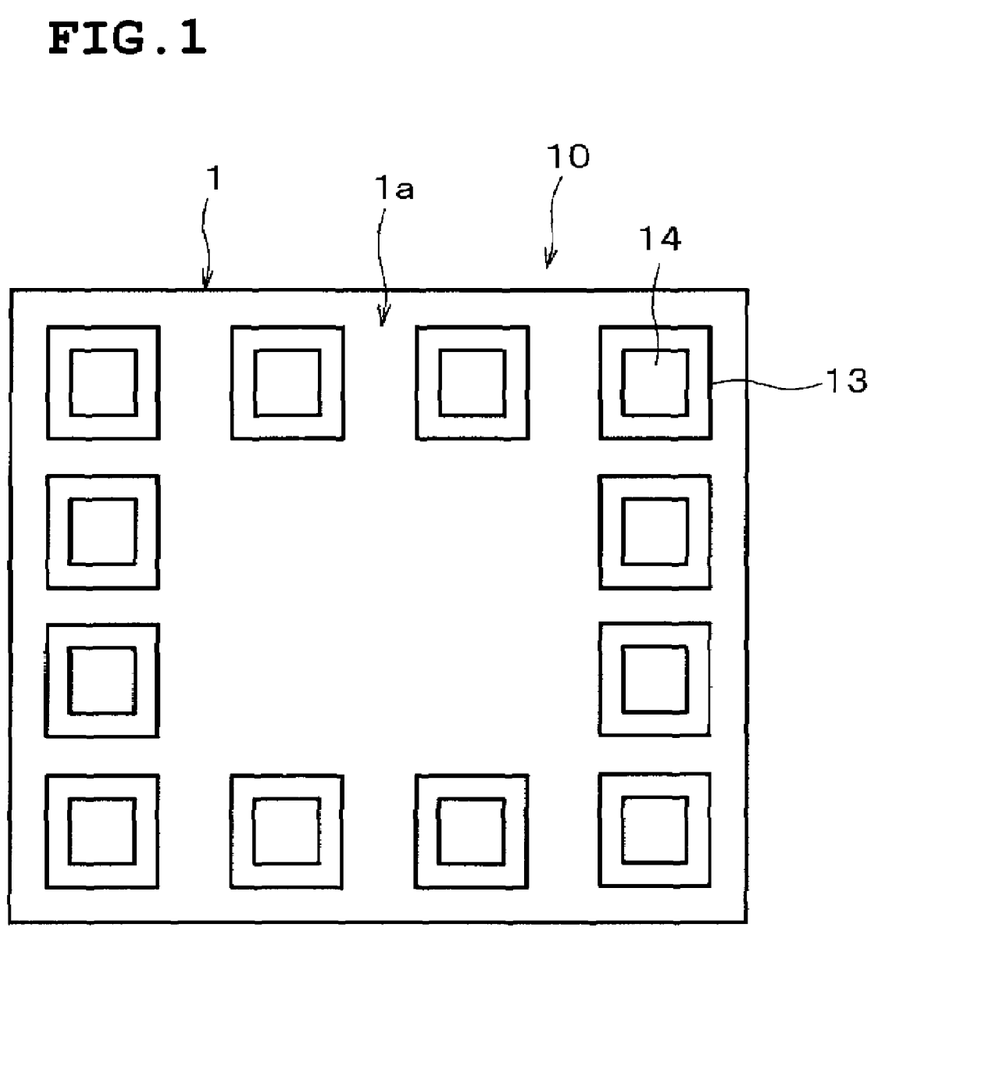
FIG. 1 shows conductors arranged on a first main surface of a ceramic substrate according to a preferred embodiment of the present invention.
Figure 2A:
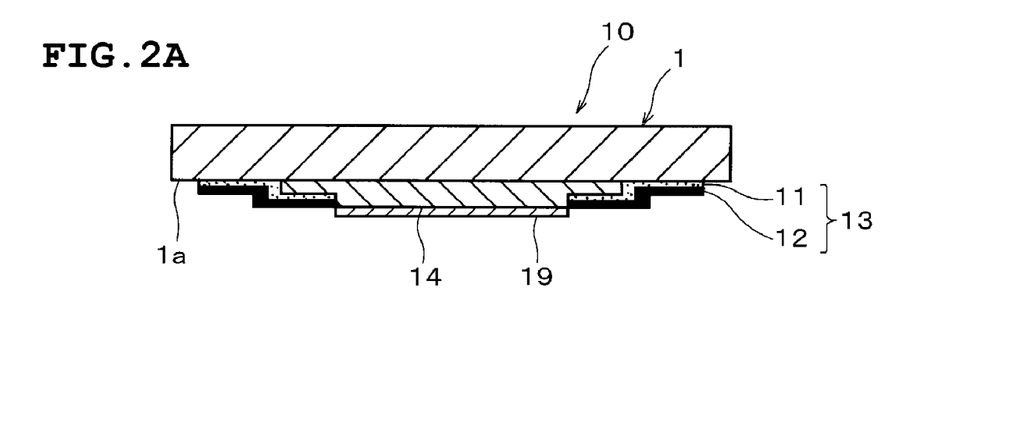
FIG. 2A is an enlarged cross-sectional view of a conductor and its vicinity of a ceramic substrate according to a preferred embodiment of the present invention.

FIG. 1 shows the conductors arranged on the first main surface of the ceramic substrate produced by the above-described method. FIG. 2A is an enlarged cross-sectional view of the conductor and its vicinity according to this preferred embodiment.

In this preferred embodiment, as shown in FIGS. 1 and 2A, a ceramic substrate 10 was produced, the ceramic substrate 10 including a plurality of conductors (land electrodes) 14 arranged on the periphery of a first main surface 1a of the main body 1 of a ceramic substrate, the entire periphery of each conductor 14 being covered with a glass layer 13 having a double-layered structure including a first glass sublayer 11 and a second glass sublayer 12.

As shown in FIG. 2A, the surface of the conductor 14 is flush with the second glass sublayer 12 surrounding the conductor 14. To make the structure, for example, the first and second glass sublayers 11 and 12 are formed while the conductor 14 is pressed. Alternatively, after the formation of the first and second glass sublayers 11 and 12, the conductive paste for forming the conductor 14 is further applied.

Shapes of the conductor and its vicinity are not limited to the above-described structure, and instead, may have a structure described below.

Figure 2B:
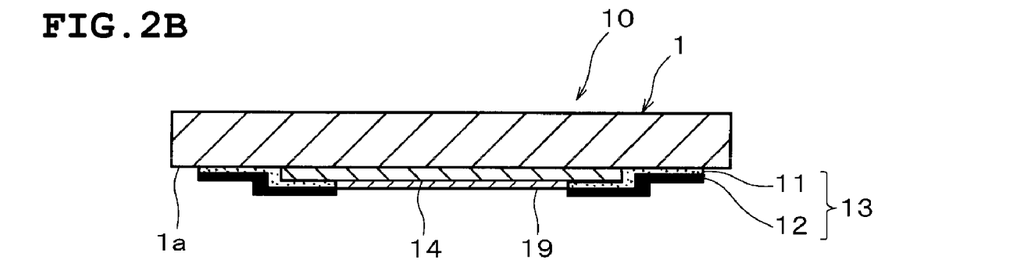
FIGS. 2B and 2C are enlarged cross-sectional views of a conductor and its vicinity on a ceramic substrate according to another preferred embodiment of the present invention.

For example, as shown in FIG. 2B, the surface of the conductor 14 may be disposed at a level lower than the first and second glass sublayers 11 and 12 disposed in the vicinity thereof.

Figure 2C:
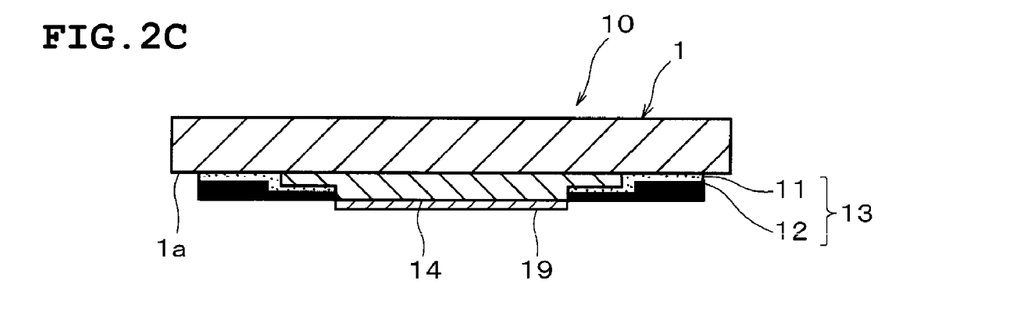

Alternatively, as shown in FIG. 2C, substantially the entire surface of the second glass sublayer 12 may be located at a level equal to the surface of the conductor 14.

Furthermore, a plating film 19 is formed on the surface of the conductor 14. In this case, as shown in FIGS. 2A and 2C, when the plating film 19 is formed so as to be located above the surface of the second glass sublayer 12, electrical connection between the mounting board and the conductor 14 is further ensured, which is preferred.

In FIG. 2B, the plating film 19 is located at below the surface of the second glass sublayer 12. However, the plating film may be formed so as to be located at a level equal to the surface of the second glass sublayer 12. Alternatively, the plating film may be formed so as to be located above the surface of the second glass sublayer 12.

Furthermore, in order to form the conductor 14 (see FIG. 2C) so as to be located at a level equal to the surface of the second glass sublayer 12 before the formation of the plating film 19, the conductive paste is further applied to increase the thickness of the conductor 14, after that the plating film 19 may be formed as shown in FIG. 2C.

Figure 3:
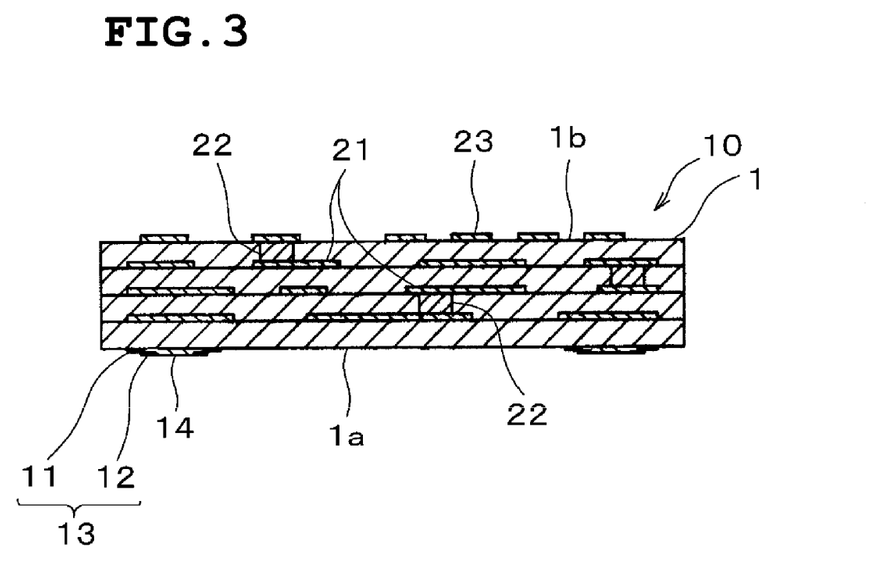
FIG. 3 is a cross-sectional view of the structure of a ceramic substrate according to a preferred embodiment of the present invention.

FIG. 3 is a cross-sectional view of the structure of the ceramic substrate produced by the above-described method. As shown in FIG. 3, the ceramic substrate 10 includes in-plane conductors 21 arranged to define a circuit and via holes 22 providing interlayer connection of the in-plane conductors 21 in the main body 1 of the ceramic substrate. The ceramic substrate 10 also includes surface conductors 23 and other suitable structure on the upper surface of the main body 1 of the ceramic substrate. Furthermore, the ceramic substrate 10 is configured such that the plurality of conductors (land electrodes) 14 are arranged on the first main surface 1a (lower surface in FIG. 3). The periphery of each conductor 14 is covered with the glass layer 13 having the double-layered structure including the first glass sublayer 11 and the second glass sublayer 12.

Evaluation of Properties

1. Rate of Occurrence of Crack

Figure 4:
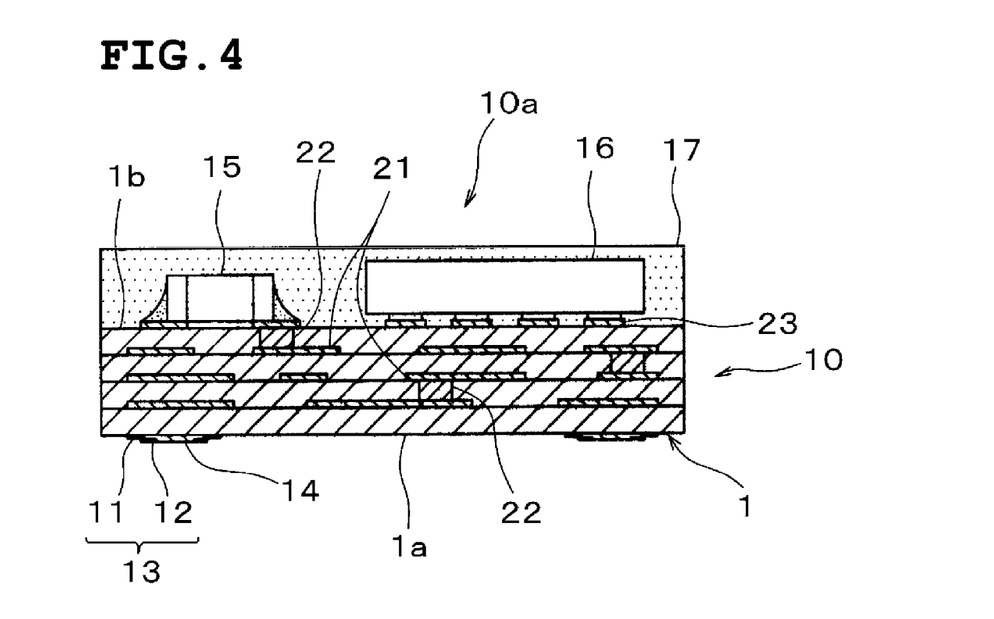
FIG. 4 shows a state in which surface mount components are mounted on a ceramic substrate according to a preferred embodiment of the present invention and then sealed with a sealing resin.

As shown in FIG. 4, required surface mount components 15 and 16 were mounted by soldering on a second main surface 1b of the main body 1 of the ceramic substrate produced as described above. Then, the surface mount components 15 and 16 were sealed with a sealing resin 17 primarily composed of an epoxy resin to form a predetermined circuit board 10a. That is, the ceramic substrate 10 on which the surface mount components 15 and 16 were mounted and sealed with the sealing resin 17 was obtained.

Figure 5:
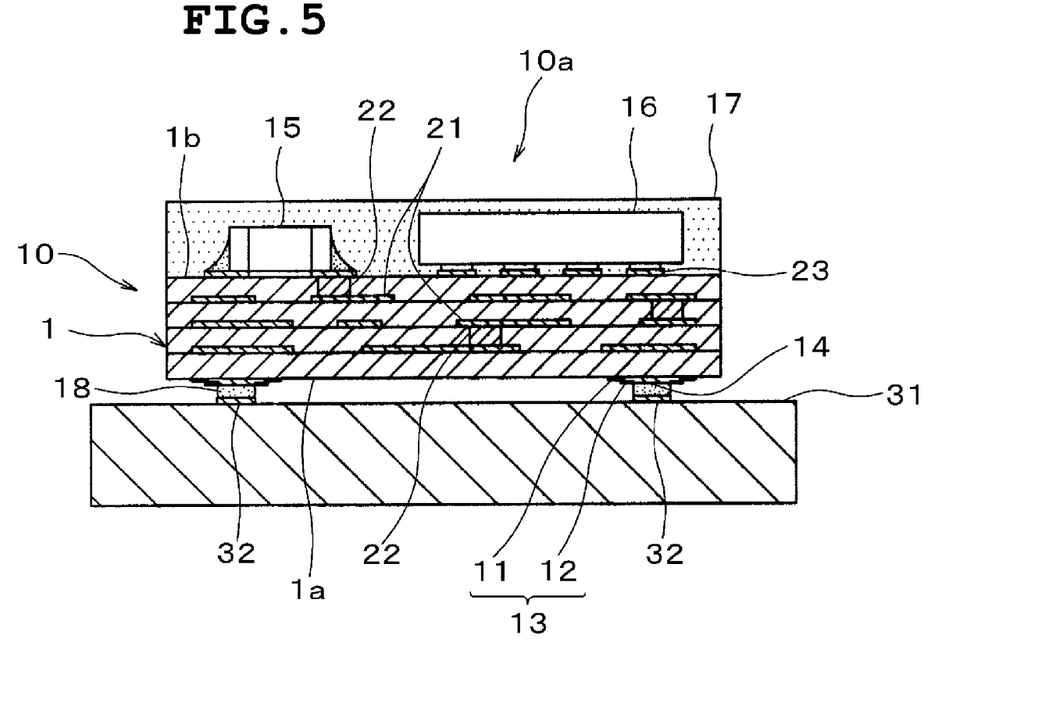
FIG. 5 shows a state in which after surface mount components are mounted on a ceramic substrate (circuit board) and sealed with a sealing resin, the ceramic substrate is mounted on an epoxy resin board as a mounting board by solder mounting.

As shown in FIG. 5, the first main surface 1a, having the land electrodes (conductors) 14 and the glass layer 13, of the circuit board 10a was mounted on an epoxy resin board 31 defining a mounting board with solder to connect the land electrodes 14 of the circuit board 10a to mounting lands 32 of the epoxy resin board 31.

The epoxy resin board 31 on which the circuit board 10a was mounted was subjected to a 400-cycle-load test in the range of about −55° C. to about 125° C. Then, the entire circuit board 10a was impregnated with a red check penetrant and washed with a solvent by ultrasonic cleaning. The presence or absence of a crack was checked. The results demonstrated that no crack was observed.

A stress due to the difference in thermal expansion coefficient between the mounting board and the ceramic substrate may concentrate on a low-strength portion under the load of the heat cycle, resulting in the occurrence of a crack at the interface between the conductor (land electrode) of the ceramic substrate and the surrounding ceramic. As described above, it is possible to obtain a highly reliable crack-free ceramic substrate even under heat cycle conditions, the ceramic substrate including the glass layer 13 having satisfactory adhesion strength to the ceramic material and satisfactory plating resistance because the periphery of each conductor (land electrode) 14 is coated with the glass layer 13 having the double-layered structure including the first glass sublayer 11 composed of a glass material having the same composition as the glass material included in the ceramic material defining the main body 1 of the ceramic substrate and the second glass sublayer 12 composed of a glass material that is less soluble in a plating solution than the glass material of the first glass sublayer 11.

2. Migration Evaluation Test

Figure 6:
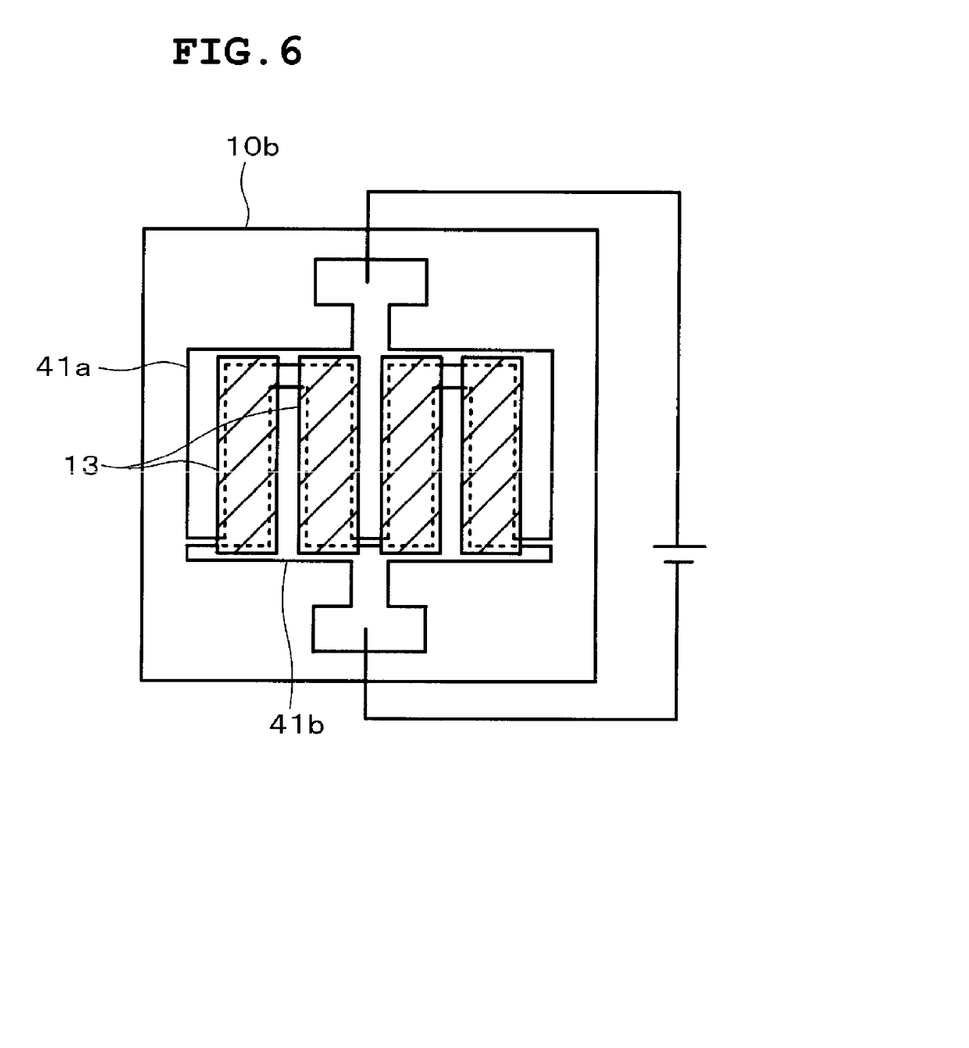
FIG. 6 shows a ceramic substrate produced in order to be subjected to a migration evaluation test.

To perform a migration evaluation test, as shown in FIG. 6, according to the same method as that in the above-described preferred embodiment, a ceramic substrate 10b including a pair of interdigital electrodes 41a and 41b (line/space=100 μm/150 μm) on a surface thereof and the glass layer 13 having the double-layered structure including the first glass sublayer 11 and the second glass sublayer 12 was produced, the glass layer 13 being arranged on the interdigital electrodes 41a and 41b as shown in FIG. 6.

After deionized water was dropped on the interdigital electrodes 41a and 41b of the ceramic substrate 10b, 10 V DC was applied. The time period until short-circuiting between the interdigital electrodes 41a and 41b occurs was measured. The results demonstrated that the time for short-circuiting between the interdigital electrodes 41a and 41b was about 5 minutes and that the ceramic substrate 10b having the above-described structure had satisfactory migration resistance.

The glass included in the ceramic defining the main body of the ceramic substrate is selected based on the properties of the ceramic substrate. In many cases, film properties are not considered. When the periphery of each conductor is covered with such glass, defects such as a pinhole occur frequently in the glass layer. Even when the thickness is increased in order to prevent the occurrence of the pinhole, plating resistance is likely to be insufficient resulting from the material properties. In this situation, it is difficult to prevent a failure such as a pinhole due to erosion caused by a plating solution. However, according to preferred embodiments of the present invention, the periphery of each conductor (land electrode) is coated with the glass layer having the double-layered structure including the first glass sublayer composed of a glass material having the same composition as the glass material included in the ceramic material defining the main body of the ceramic substrate and the second glass sublayer composed of a glass material less soluble in a plating solution than the glass material of the first glass sublayer. As a result, it is possible to obtain the highly reliable ceramic substrate free from a defect, such as a pinhole, the ceramic substrate including the glass layer having satisfactory adhesion to the ceramic and satisfactory plating resistance.

For comparison, a ceramic substrate in which the glass layer for overlaying the periphery of each land electrode had a single layer structure including only the first glass sublayer according to a preferred embodiment of the present invention, i.e., including only the first glass sublayer composed of a glass material having the same composition as the glass material included in the ceramic material defining the main body of the ceramic substrate, was produced. The properties were checked. No occurrence of a crack due to the heat cycle described above was observed in the ceramic substrate. However, when the migration evaluation test described above was performed in the same conditions as in the above-described preferred embodiment, the time for short-circuiting between the electrodes was about 10 seconds, that was rather short. The dendritic growth of Ag, i.e., the migration of Ag, was observed.

For comparison, a ceramic substrate in which the glass layer for overlaying the periphery of each land electrode had a single layer structure including only the second glass sublayer according to a preferred embodiment of the present invention, i.e., including only the second glass sublayer composed of the glass material less soluble in a plating solution than the glass material for the first glass sublayer, was produced. The properties were checked. The occurrence of a crack due to the heat cycle was observed in the ceramic substrate. Furthermore, when the migration evaluation test described above was performed in the same conditions as in the above-described preferred embodiment, the time for short-circuiting between the electrodes was about 15 seconds. The dendritic growth of Ag from a portion where the glass was detached, i.e., the migration of Ag, was observed.

Figure 7:
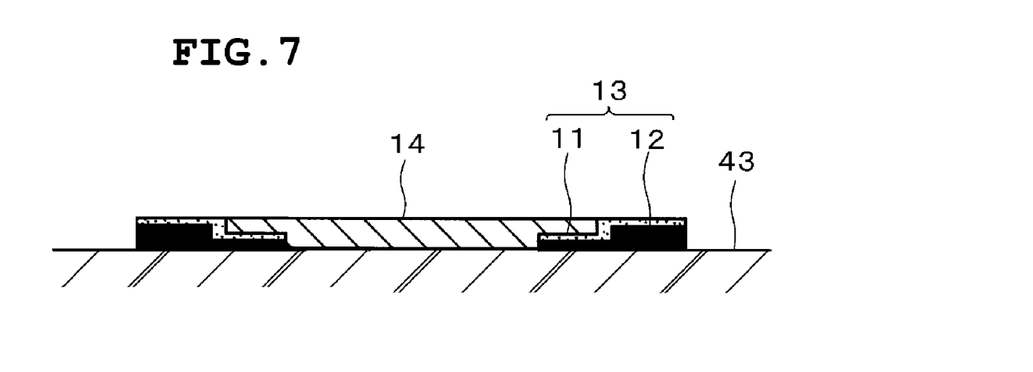
FIG. 7 illustrates a step of forming a conductor to be a land electrode in a method for producing a ceramic substrate according to a preferred embodiment of the present invention.

In the above-described preferred embodiment, each conductor having the periphery covered with the glass layer was formed by applying the conductive paste for the conductor, the glass paste for the first glass sublayer, and the glass paste for the second glass sublayer on the ceramic green sheet. When the conductor 14 to be formed into the land electrode was formed as shown in FIG. 7, the glass paste for the second glass sublayer was applied by printing to a support 43 to form the second glass sublayer 12 having an opening. The glass paste for the first glass sublayer 11 was applied by printing on the second glass sublayer 12 to form the first glass sublayer 11 having an opening. The conductive paste for the conductor was applied by printing to the openings of the first glass sublayer 11 and the second glass sublayer 12 to form the conductor 14. Then, the conductor 14, the glass layer 13 including the first glass sublayer 11, and the second glass sublayer 12 on the support 43 were transferred to the first main surface of the ceramic substrate. Thereby, the conductor having the periphery covered with the glass layer having the double-layered structure including the first glass sublayer and the second glass sublayer was formed on the first main surface of the ceramic laminate.

Alternatively, the conductor 14 and the first and second glass sublayers 11 and 12 may be formed on the ceramic substrate 10 (ceramic laminate) according to a method described below with reference to FIGS. 8A, 8B, and 8C.

Figure 8A:
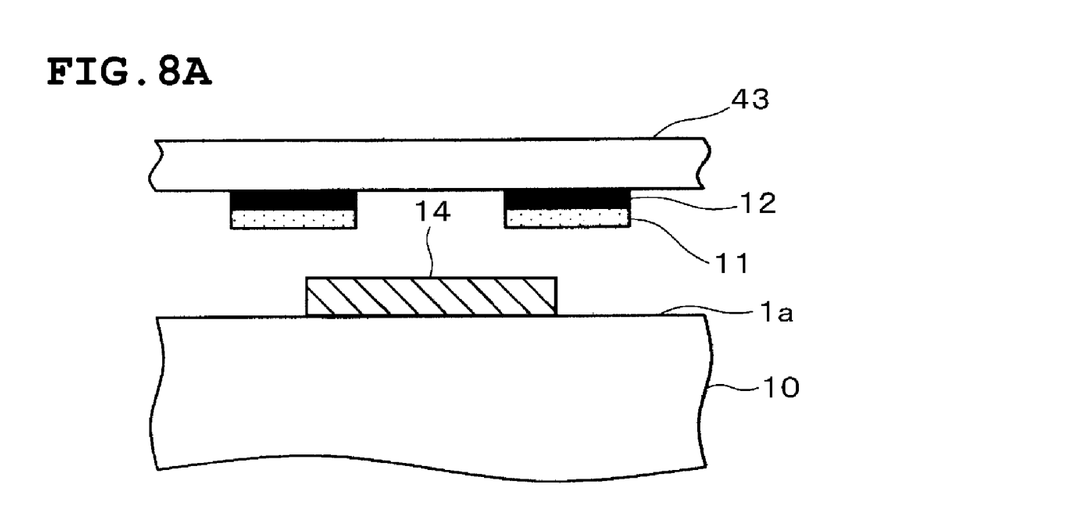
FIGS. 8A, 8B, and 8C show other steps of forming a conductor and a glass layer.

As shown in FIG. 8A, the conductive paste for the conductor was applied by printing or transferred to the first main surface 1a of the ceramic substrate (ceramic laminate) 10 to form the conductor 14.

The glass paste for the second glass sublayer was applied by printing to a surface of the support 43 to form the second glass sublayer 12 having an opening. The glass paste for the first glass sublayer was applied by printing to the second glass sublayer to form the first glass sublayer 11 having an opening.

Figure 8B:
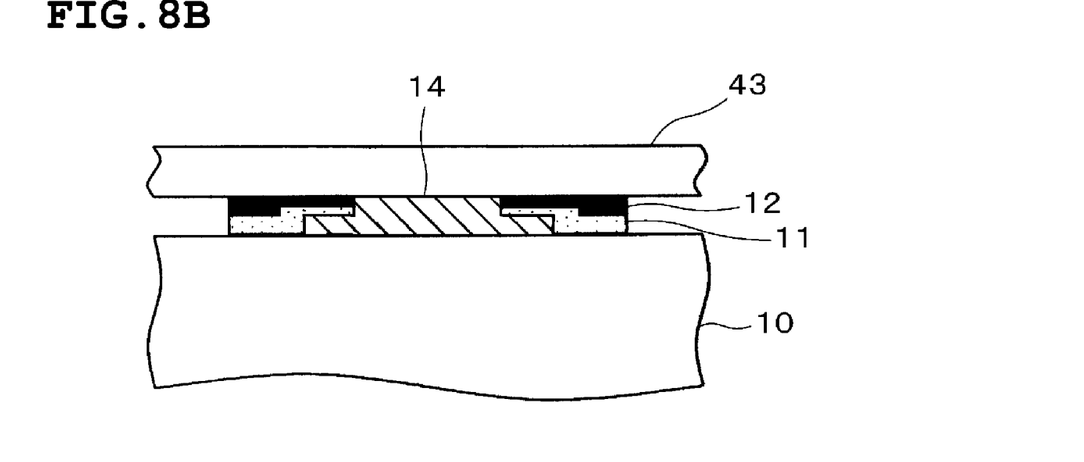
Figure 8C:
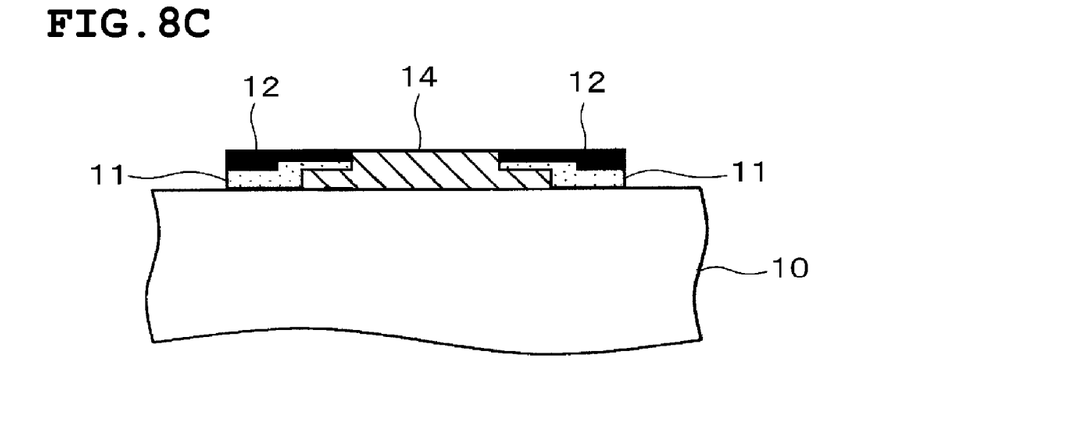

The first and second glass sublayers 11 and 12 formed on the surface of the support 43 were transferred to the ceramic substrate (ceramic laminate) 10 including the conductor 14 (FIG. 8B). The support 43 was removed (FIG. 8C) to cover the periphery of the conductor 14 on the ceramic substrate (ceramic laminate) 10 with the first and second glass sublayers 11 and 12.

Alternatively, the glass pastes for the first and second glass sublayers were applied by printing on two different supports to form the first glass sublayer on one support and the second glass sublayer on the other support. The first glass sublayer and the second glass sublayer were transferred to the ceramic substrate (ceramic laminate) including the conductor in the order of the first glass sublayer and the second glass sublayer. Thereby, the periphery of the conductor 14 on the ceramic substrate (ceramic laminate) 10 may be covered with the first and second glass sublayers 11 and 12 as shown in FIG. 8C.

FIG. 5 shows a state in which the conductors 14 on the ceramic substrate 10 (circuit board 10a) are connected to the mounting board (epoxy resin board) 31 with solder 18, and also shows an example of an electronic apparatus according to a preferred embodiment of the present invention.

In the electronic apparatus, the conductors 14 on the ceramic substrate 10 are securely connected to the mounting board with the solder 18, and the periphery of each conductor 14 on the ceramic substrate 10 in the above-described preferred embodiment is covered with the glass layer 13 having the double-layered structure. The glass layer 13 has satisfactory adhesion to the main body 1 of the ceramic substrate and satisfactory plating resistance. Thus, it is possible to obtain a highly reliable electronic apparatus including a highly reliable ceramic substrate 10 mounted on the mounting board.

Figure 9A:
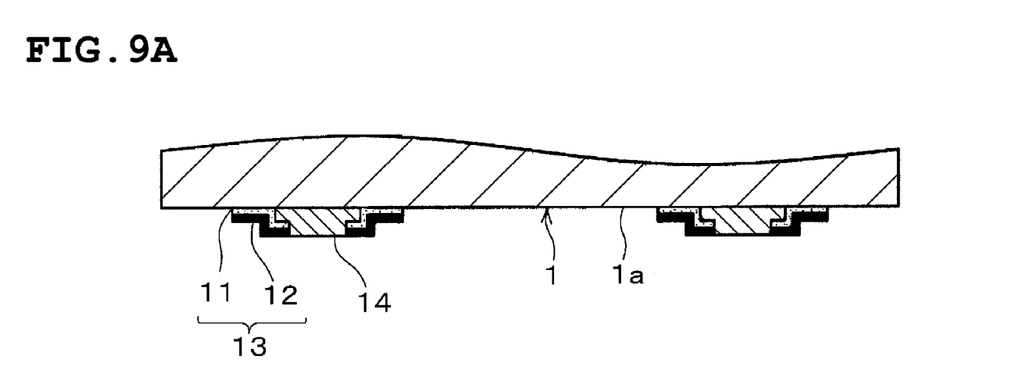
FIGS. 9A, 9B, and 9C show arrangements of a glass layer partially overlaying a conductor.
Figure 9B:
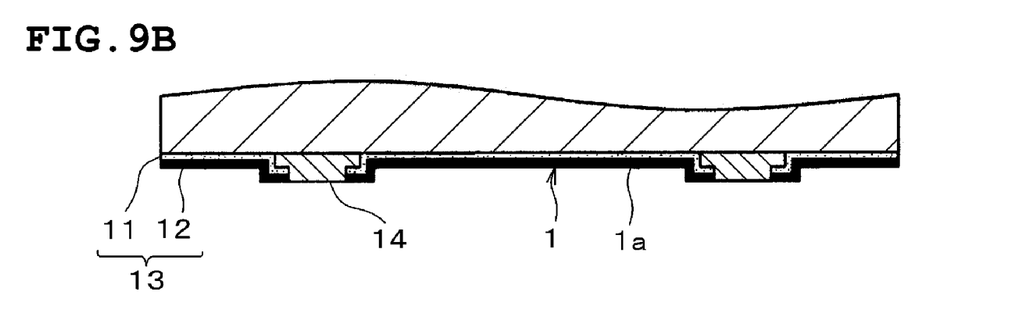
Figure 9C:
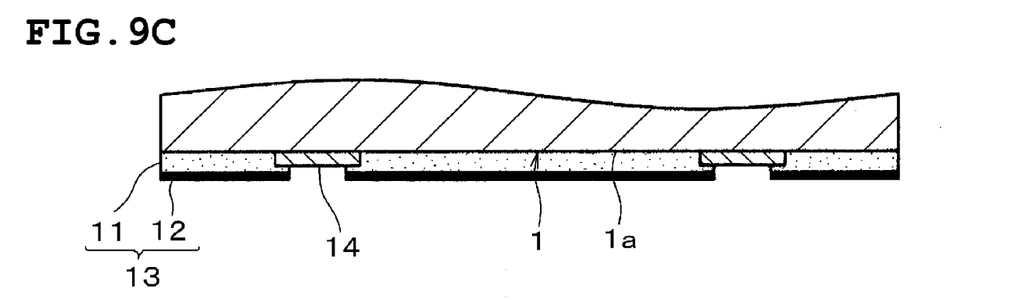

FIGS. 9A, 9B, and 9C show arrangements of the glass layer 13 partially overlaying the conductor 14.

FIG. 9A shows an arrangement of the glass layer 13. In the above-described preferred embodiment, when the periphery of each conductor 14 is covered with the corresponding glass layer 13, each glass layer 13 is arranged so as to overlay only the periphery and its vicinity of the corresponding conductor 14. Alternatively, in the ceramic substrate according to the present invention, as shown in FIGS. 9B and 9C, when the periphery of each conductor 14 is covered with the glass layer 13, the entire region may be covered with the glass layer 13 except for regions where the conductors 14 are exposed.

In FIG. 9B, the exposed surface of each conductor 14 and the surface of the glass layer 13 on the periphery of each conductor 14 protrude from the surrounding surface. In FIG. 9C, the exposed surface of each conductor 14 is located at a level below the surface of the surrounding glass layer 13. That is, the exposed surfaces of the conductors 14 are arranged so as to define bottoms of recesses.

With the structure shown in FIG. 9C, the surface of each conductor 14 may be located at a level equal to the surface of the surrounding glass layer 13 by applying the conductive paste in the recesses. Alternatively, a structure in which the conductors protrude from the surface of the glass layer may be made by applying the conductive paste. The height of each conductor may be adjusted with metal foil instead of the conductive paste.

In any case, the arrangement of the conductors 14 and the glass layer 13 partially overlaying each conductor 14 is not particularly limited. Various modifications may be made.

FIGS. 9A, 9B, and 9C each show substantially square bumps between the glass layer 13 and the conductor 14. Alternatively, a structure including bumps having a gradually changing thickness may be used.

The present invention is not limited to the above-described preferred embodiment. With respect to the type of ceramic material defining the main body of the ceramic substrate, the shape and material of the conductor, the type and composition of the glass material defining the glass layer, and other features, various applications and changes may be made within the scope of the present invention.

As described above, according to various preferred embodiments of the present invention, partially covering each conductor with the glass material prevents stress concentration on the conductors due to the heat cycle, improves the adhesion properties of the glass layer, which is arranged to partially overlay each conductor to be formed into the land electrode, to the main body of the ceramic substrate, and improves the plating resistance of the glass layer, thereby obtaining a highly reliable ceramic substrate.

Thus, preferred embodiments of the present invention can be widely applied to fields, such as ceramic substrates, methods for producing the ceramic substrates, and electronic apparatuses including the ceramic substrates.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A ceramic substrate comprising:
   a main body of the ceramic substrate;
   a conductor disposed on a first main surface of the main body of the ceramic substrate; and
   a glass layer extending from a portion of the conductor to the first main surface of the main body of the ceramic substrate; wherein
   the glass layer includes:
   a first glass sublayer made of a first glass material and extending from the portion of the conductor to the first main surface of the main body of the ceramic substrate;
   a second glass sublayer made of a second glass material different from the first glass material defining the first glass sublayer, the second glass sublayer being disposed on the first glass sublayer; and
   the first glass material has a greater adhesion to the main body of the ceramic substrate than the second glass material, and the second glass material has a greater plating resistance than the first glass material.

2. The ceramic substrate according to claim 1, wherein
   a ceramic material defining the main body of the ceramic substrate includes a glass material;
   the first glass material has the same composition as the glass material included in the ceramic material defining the main body of the ceramic substrate; and
   the second glass material is less soluble in a plating solution than the first glass material.

3. The ceramic substrate according to claim 1, wherein the glass layer is arranged to overlay a periphery of the conductor disposed on the main surface of the main body of the ceramic substrate.

4. The ceramic substrate according to claim 1, wherein the second glass sublayer is arranged to overlay substantially the entire first glass sublayer.

5. The ceramic substrate according to claim 1, wherein the first glass material includes a borosilicate glass, and the second glass material includes a glass material primarily composed of Si, B, and Zn.

6. The ceramic substrate according to claim 1, wherein a plating film is provided on a surface of the conductor.

7. An electronic apparatus comprising:
   a mounting board; and
   the conductor of the ceramic substrate according to claim 1; wherein
   the conductor is connected to the mounting board with solder.

* * * * *